(12) United States Patent
Lee et al.

(10) Patent No.: US 10,205,090 B2
(45) Date of Patent: Feb. 12, 2019

(54) SEMICONDUCTOR MEMORY DEVICE (71) Applicants: Yil-hyung Lee, Hwaseong-si (KR);
Jong-Kyu Kim, Seongnam-si (KR);
Jongsoon Park, Suwon-si (KR);
Jongchul Park, Seongnam-si (KR)

(72) Inventors: Yil-hyung Lee, Hwaseong-si (KR);
Jong-Kyu Kim, Seongnam-si (KR);
Jongsoon Park, Suwon-si (KR);
Jongchul Park, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/429,494

(22) Filed: Feb. 10, 2017

(65) Prior Publication Data
US 2017/0352801 A1    Dec. 7, 2017

(30) Foreign Application Priority Data
Jun. 1, 2016   (KR) .................. 10-2016-0068222

(51) Int. Cl.
| H01L 43/08 | (2006.01) |
| H01L 43/02 | (2006.01) |
| H01L 27/22 | (2006.01) |

(52) U.S. Cl.
CPC ............ *H01L 43/08* (2013.01); *H01L 27/228* (2013.01); *H01L 43/02* (2013.01)

(58) Field of Classification Search
CPC ... H01L 43/08; H01L 43/02; H01L 21/67709; H01L 27/20–27/224; H01L 41/00; H01L 41/06; H01L 41/12; H01L 41/20; H01L 41/47; H01L 43/00
See application file for complete search history.

(56) References Cited

U.S. PATENT DOCUMENTS

| 6,566,241 | B2 | 5/2003 | Chun |
| 7,560,337 | B2 | 7/2009 | Ho et al. |
| 8,242,034 | B2 | 8/2012 | Lin et al. |
| 8,753,949 | B2 | 6/2014 | Ramaswamy et al. |
| 8,987,846 | B2 | 3/2015 | Kumura |
| 9,054,297 | B2 | 6/2015 | Nagel et al. |
| 9,082,954 | B2 | 7/2015 | Lung et al. |
| 2009/0057640 | A1 | 3/2009 | Lin et al. |
| 2012/0205805 | A1 | 8/2012 | Hyun |
| 2013/0119494 | A1* | 5/2013 | Li .................... H01L 43/08 257/421 |
| 2014/0203385 | A1* | 7/2014 | Kobayashi ........ H01L 43/10 257/427 |
| 2015/0236251 | A1 | 8/2015 | Noh et al. |
| 2016/0005953 | A1* | 1/2016 | Lee .................... H01L 43/08 711/126 |

(Continued)

*Primary Examiner* — Cuong B Nguyen
(74) *Attorney, Agent, or Firm* — Harness, Dickey & Pierce, PLC (57) ABSTRACT

A semiconductor memory device that includes at least a lower contact plug on a semiconductor substrate, a magnetic tunnel junction of the lower contact plug, and a barrier pattern on a sidewall of the lower contact plug may further include an insulation pattern on the sidewall of the lower contact plug. The insulation pattern may be between the barrier pattern and the magnetic tunnel junction pattern. The insulation pattern may include an upper portion and a lower portion whose width is greater than a width of the upper portion.

9 Claims, 12 Drawing Sheets

(56) References Cited

U.S. PATENT DOCUMENTS

2016/0027843 A1* 1/2016 Kumura ............... H01L 27/228
 257/295
2016/0072051 A1* 3/2016 Iwayama ............... H01L 43/08
 257/421

* cited by examiner

SEMICONDUCTOR MEMORY DEVICE

CROSS-REFERENCE TO RELATED APPLICATIONS

This U.S. nonprovisional patent application claims priority under 35 U.S.C. § 119 of Korean Patent Application 10-2016-0068222 filed on Jun. 1, 2016, the entire contents of which are hereby incorporated by reference.

BACKGROUND

The present inventive concepts relate to a semiconductor memory device and, more particularly, to a magnetic memory device having enhanced electrical characteristics and reliability.

There is an increased demand for memory devices having greater density and lower power consumption, and non-volatility (nonvolatile memory devices), with the development of portable computing devices and wireless communication device. Magnetic memory devices have become one of the main candidates that can satisfy such demands. As a result, research into magnetic memory devices is ongoing.

In some cases, a tunnel magneto-resistance (TMR) effect occurring in a magnetic tunnel junction (MTJ) may be used as a data storing mechanism in the magnetic memory device. MTJs having the TMR of several hundred percent to several thousand percent have been developed in 2000's, such that various researches have recently been increasingly conducted for the magnetic memory devices having the MTJ.

SUMMARY

Example embodiments of the present inventive concepts provide a semiconductor memory device having an enhance reliability.

According to some example embodiments of the present inventive concepts, a semiconductor memory device may comprise: a select element on a semiconductor substrate; a magnetic tunnel junction pattern on the select element; a lower contact plug connecting the select element to the magnetic tunnel junction pattern; a barrier pattern on a lower portion of a sidewall of the lower contact plug; and an insulation pattern on an upper portion of the sidewall of the lower contact plug, the insulation pattern being between the barrier pattern and the magnetic tunnel junction pattern. The insulation pattern may include an upper portion and a lower portion, the lower portion having a greater width than a width of the upper portion.

According to some example embodiments of the present inventive concepts, a semiconductor memory device may comprise: a select element on a semiconductor substrate; a lower contact plug electrically connected to the select element; a barrier pattern surrounding at least a portion of the lower contact plug; and a magnetic tunnel junction pattern electrically connected to the lower contact plug. The magnetic tunnel junction pattern may at least partially expose at least one top surface of the barrier pattern.

According to some example embodiments of the present inventive concepts, a semiconductor memory device, may include a lower contact plug on a semiconductor substrate; a barrier pattern on at least a portion of a sidewall of the lower contact plug; a magnetic tunnel junction pattern on the lower contact plug; and an insulation pattern between the barrier pattern and the magnetic tunnel junction pattern. The insulation pattern may cover at least a top surface of the barrier pattern.

DETAILED DESCRIPTION OF EMBODIMENTS

Figure 1:
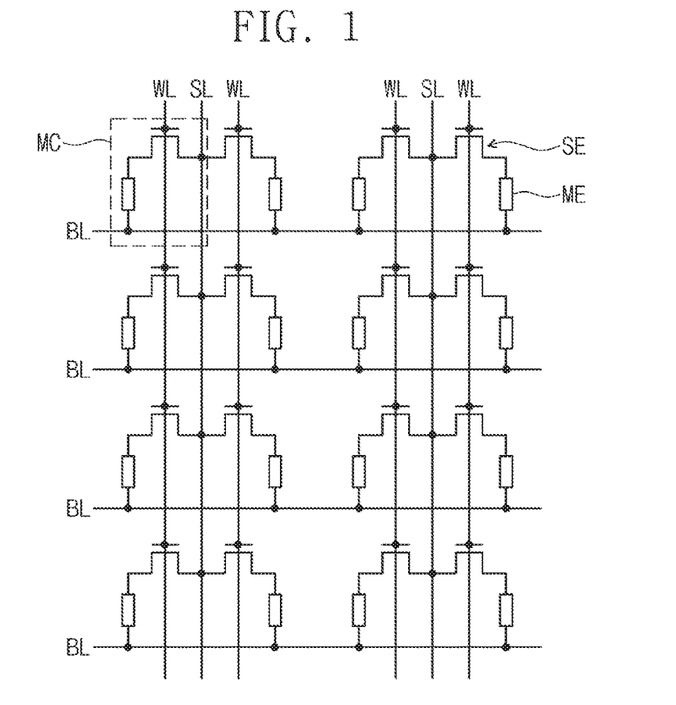
FIG. 1 is a circuit diagram illustrating a cell array of a semiconductor memory device according to some example embodiments of the present inventive concepts.

FIG. 1 shows a cell array of a semiconductor memory device according to some example embodiments of the present inventive concepts.

Referring to FIG. 1, a plurality of unit memory cells MC may be arranged two-dimensionally or three-dimensionally. Each of the unit memory cells MC may be connected between a word line WL and a bit line BL crossing each other. Each of the unit memory cells MC may include a memory element ME and a select element SE. The select element SE and the memory element ME may be electrically connected in series.

The memory element ME may be connected between the bit line BL and the select element SE, and the select element SE may be disposed between the memory element ME and a source line SL and controlled by the word line WL. The memory element ME may be a variable resistance device that is switched from one to the other of its two resistance states by an applied electrical pulse. For example, the memory element ME may be formed to have a thin film whose electrical resistance can be changed using a spin transferring phenomenon of an electrical current flowing through the memory element ME. The memory element ME may include a thin film structure configured to exhibit a magneto-resistance property and include at least one ferromagnetic material and/or at least one antiferromagnetic material.

The select element SE may be configured to selectively control a current flow to the memory elements ME based on voltages of the word lines WL. The select element SE may be one of a diode, a PNP bipolar transistor, an NPN bipolar transistor, an NMOS field effect transistor, and a PMOS field effect transistor. For example, if and/or when the select element SE includes a three terminal device such as a bipolar transistor or a MOS field effect transistor, the memory array may further include the source line SL connected to a source electrode of transistor. In some example embodiments, the source line SL may be disposed between adjacent word lines WL and thus two transistors may share one source line SL.

Figure 2:
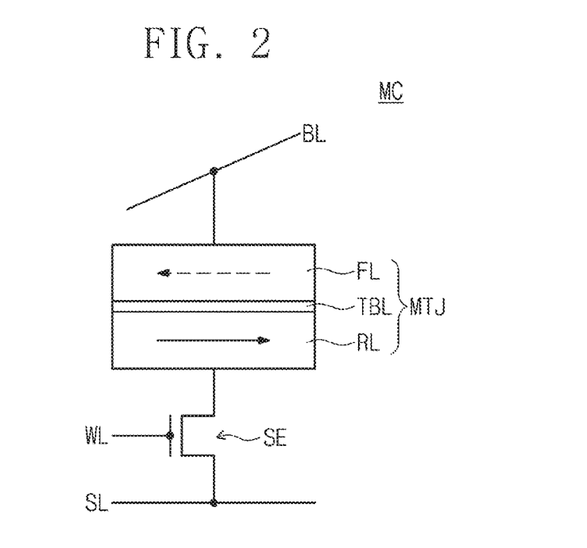
FIG. 2 is a circuit diagram illustrating a unit memory cell of a semiconductor memory device according to some example embodiments of the present inventive concepts.

FIG. 2 shows a unit memory cell of a semiconductor memory device according to some example embodiments of the present inventive concepts.

Referring to FIG. 2, each of the unit memory cells MC may include the memory element and the select element SE. For example, the select element SE may be a MOS field effect transistor, and the memory element may include a magnetic tunnel junction MTJ. The magnetic tunnel junction MTJ may be connected between the bit line BL and the select element SE, and the select element SE may be connected between the magnetic tunnel junction MTJ and the source line SL and be controlled by the word line WL.

The magnetic tunnel junction MTJ may include a plurality of magnetic layer FL and RL and a tunnel barrier layer TBL between the magnetic layers FL and RL. One RL of the magnetic layers FL and RL may be a reference layer whose magnetization direction is fixed regardless of an external magnetic field or a spin transfer torque under a normal use environment. The other FL of the magnetic layers FL and RL may be a free layer whose magnetization direction is freely changed by the external magnetic field.

The magnetic tunnel junction MTJ may store data in the unit memory cell MC using a difference of the electrical resistance in accordance with the magnetization directions of the magnetic layers FL and RL. The electrical resistance of the magnetic tunnel junction MTJ may be adjusted by changing the magnetization direction of the free layer FL. And, the magnetic tunnel junction MTJ may have an electrical resistance whose value is much larger in case that the magnetization directions of the reference layer RL and the free layer FL are anti-parallel to each other than in case that that the magnetization directions of the reference layer RL and the free layer FL are parallel to each other.

Figure 3A:
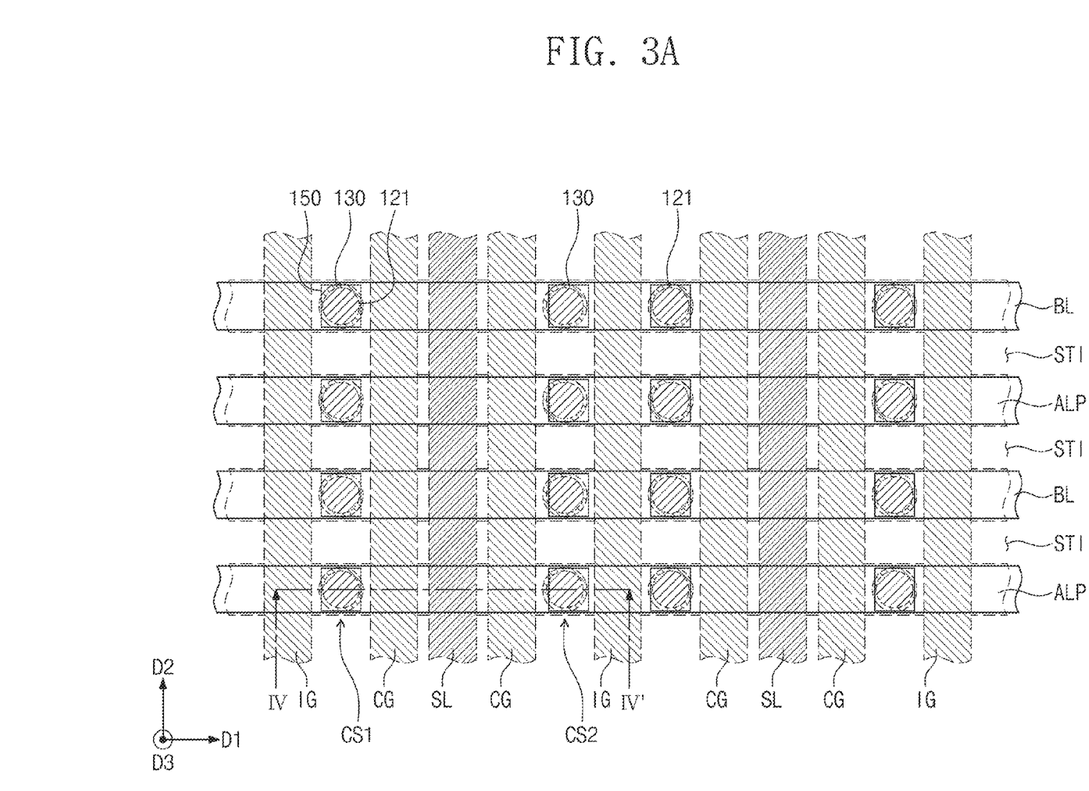
FIG. 3A is a plan view illustrating a semiconductor memory device according to some example embodiments of the present inventive concepts.
Figure 3B:
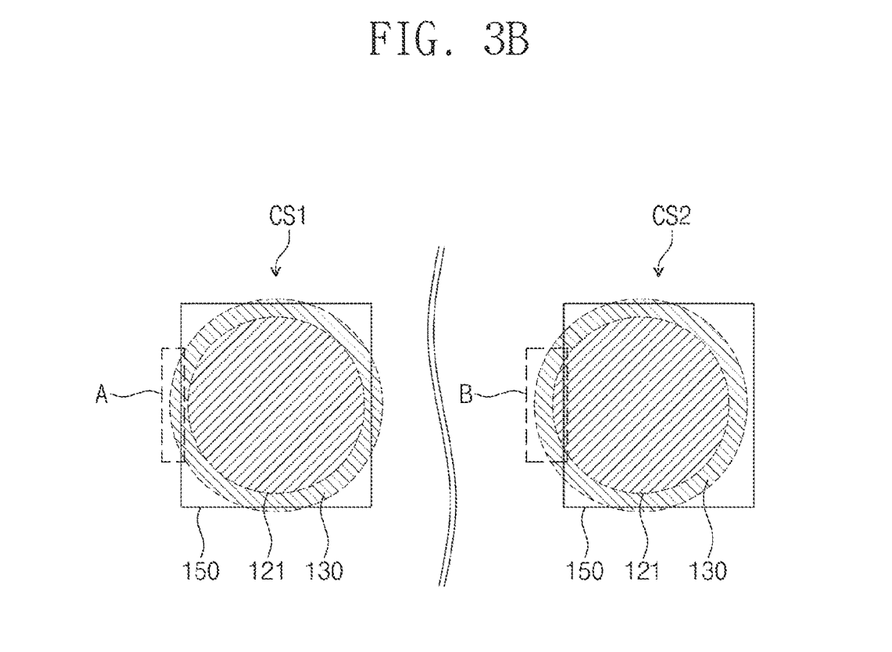
FIG. 3B is an enlarged view of the cell structures of FIG. 3A.
Figure 4:
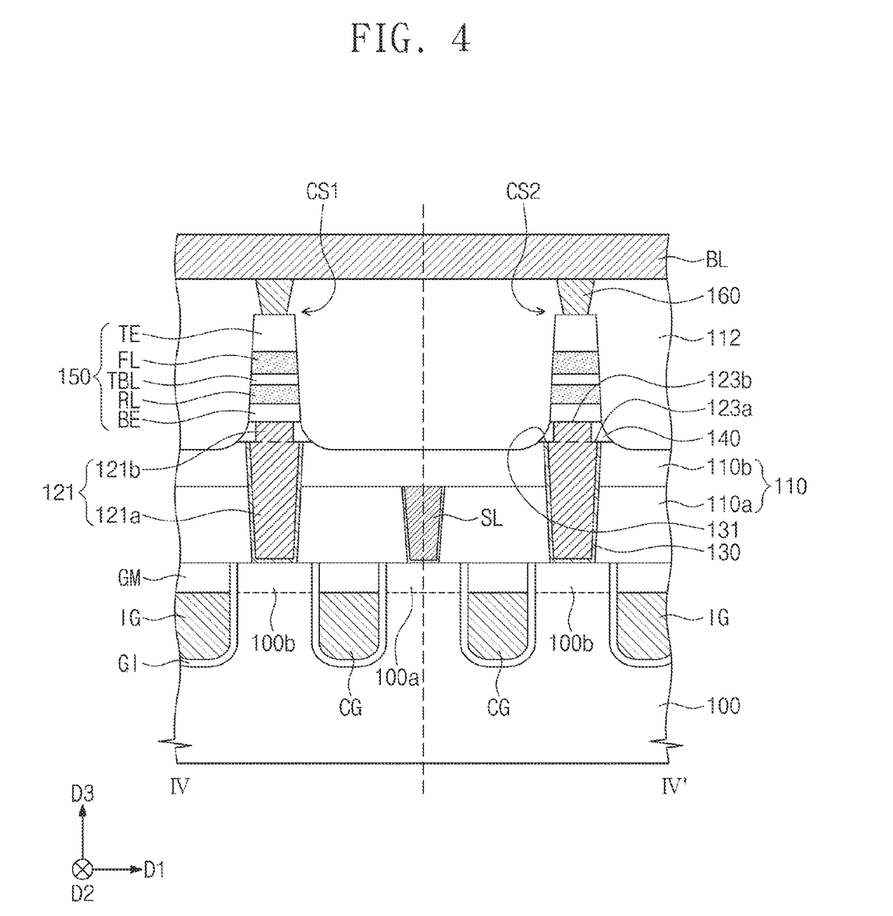
FIG. 4 is a cross-sectional view taken along line IV-IV' of FIG. 3A illustrating a semiconductor memory device according to some example embodiments of the present inventive concepts.

FIG. 3A is a plan view illustrating a semiconductor memory device according to some example embodiments of the present inventive concepts, and FIG. 3B is an enlarged plan view of the cell structures CS1 and CS2 of FIG. 3A. FIG. 4 is a cross-sectional view taken along line IV-IV' of FIG. 3A illustrating a semiconductor memory device according to some example embodiments of the present inventive concepts.

Referring to FIGS. 3A and 4, device isolation patterns STI may be formed to define active line patterns ALP in a semiconductor substrate 100. The substrate 100 may include a silicon substrate, a germanium substrate, and/or a silicon-germanium substrate. In some example embodiments, the active line patterns ALP may have a line shape extending in a first direction D1 and be arranged spaced apart from each other in a second direction D2 perpendicular to the first direction D1.

Each of the active line patterns ALP may be defined between the device isolation patterns STI adjacent to each other and extend parallel to the device isolation patterns STI in the first direction D1. The active line patterns ALP may be doped with first conductive impurities.

The semiconductor substrate 100 may have therein cell gate electrodes CG and isolation gate electrodes IG that run across the active line patterns ALP and the device isolation patterns STI. The cell gate electrodes CG and the isolation gate electrodes IG may have top surfaces positioned lower than a top surface of the semiconductor substrate 100. The cell gate electrodes CG and the isolation gate electrodes IG may have a line shape extending in the second direction D2 that runs across the active line pattern ALP. A gate hardmask pattern GM composed of an insulative material may be disposed on each of the cell and isolation gate electrodes CG and IG. The gate hardmask patterns GM may have top surfaces substantially coplanar (e.g., coplanar within manufacturing and/or material tolerances) with the top surface of the semiconductor substrate 100. For example, the cell gate electrode CG may include at least one of doped semiconductor material (e.g., doped silicon, etc), metal (e.g., tungsten, aluminum, titanium, and/or tantalum), conductive metal nitride (e.g., titanium nitride, tantalum nitride, and/or tungsten nitride), and metal-semiconductor compound (e.g., metal silicide). The isolation gate electrode IG may be formed of the same material as the cell gate electrode CG. The gate hardmask pattern GM may include oxide (e.g., silicon oxide), nitride (e.g., silicon nitride), and/or oxynitride (e.g., silicon oxynitride).

A gate dielectric layer GI may be disposed between the cell gate electrode CG and the semiconductor substrate 100 and between the isolation gate electrode IG and the semiconductor substrate 100. The gate dielectric layer GI may include oxide (e.g., silicon oxide), nitride (e.g., silicon nitride), oxynitride (e.g., silicon oxynitride), and/or high-k dielectric layer (e.g., insulative metal oxide such as hafnium oxide, aluminum oxide, etc.).

When a semiconductor memory device is operated, an isolation voltage may be applied to each of the isolation gate electrodes IG. The isolation voltage may limit and/or prevent channel formation below the isolation gate electrode IG. That is, the isolation voltage may turn off an isolation channel region below the isolation gate electrode IG. Accordingly, adjacent memory cells may be electrically separated from each other. For example, in case that the active line pattern ALP is doped with a p-type dopant, the isolation voltage may be a ground voltage or a negative voltage.

A first impurity region 100a may be disposed in the active line pattern ALP on one side of each of the cell gate electrodes CG, and a second impurity region 100b may be disposed in the active line pattern ALP on an opposite side of each of the cell gate electrodes CG. In some example embodiments, the first impurity region 100a may be disposed in an active region between a pair of the cell gate electrodes CG, and a pair of the second impurity regions 100b may be disposed in the active region across the pair of the cell gate electrodes CG. As a result, a pair of select transistors may share the first impurity region 100a. The first and second impurity regions 100a and 100b may be doped with a second conductivity dopant different from the first conductivity dopant of the active line patterns ALP. One of the first and second conductivity dopants may be an n-type conductivity dopant, and the other of the first and second conductivity dopants may be a p-type conductivity dopant.

In some embodiments, the first and second impurity regions 100a and 100b may correspond to source/drain regions of select transistor. In other words, the cell gate electrodes CG and the first and second impurity regions 100a and 100b formed on the semiconductor substrate 100 may constitute select transistors of a semiconductor memory device.

A first interlayer dielectric layer 110a may be disposed on an entire surface of the semiconductor substrate 100. The first interlayer dielectric layer 110a may include silicon nitride, silicon oxide, silicon oxynitride, or low-k dielectric material having a low dielectric constant. For example, the first interlayer dielectric layer 110a may include silicon nitride.

Source lines SL may be formed in the first interlayer dielectric layer 110a and extend parallel to each other in the second direction D2. As viewed in plan in FIG. 3A, each of the source lines SL may be disposed between the cell gate electrodes CG adjacent to each other. Each of the source lines SL may be electrically connected to the first impurity regions 100a arranged along the second direction D2. The source line SL may have a top surface substantially coplanar (e.g., coplanar within manufacturing and/or material tolerances) to a top surface of the first interlayer dielectric layer 110a. The source line SL may include at least one of doped semiconductor material (e.g., doped silicon, etc), metal (e.g., tungsten, aluminum, titanium, and/or tantalum), conductive metal nitride (e.g., titanium nitride, tantalum nitride, and/or tungsten nitride), and metal-semiconductor compound (e.g., metal silicide).

A second interlayer dielectric layer 110b may be disposed on the first interlayer dielectric layer 110a and the source lines SL. The second interlayer dielectric layer 110b may include silicon nitride, silicon oxide, silicon oxynitride, or low-k dielectric material having a low dielectric constant. For example, the second interlayer dielectric layer 110b may include silicon oxide. As not shown in figures, an etch stop layer may be provided between the first and second interlayer dielectric layers 110a and 110b. For convenience of the description, the first and second interlayer dielectric layers 110a and 110b may be referred to hereinafter as a lower interlayer dielectric layer 110.

A lower contact plug 121 may be provided to penetrate the lower interlayer dielectric layer 110. The lower contact plug 121 may be electrically connected to the second impurity region 100b. That is, the lower contact plug 121 may be electrically connected to a drain of select transistor. The lower contact plug 121 may be connected to a bottom electrode BE. The lower contact plug 121 may include an upper portion 121b, which is connected to the bottom electrode BE. In some example embodiments, a width of the upper portion 121b of the lower contact plug 121 may be smaller than that of the bottom electrode BE. The lower contact plug 121 may include a lower portion 121a. As shown in at least FIG. 4, a width of a lower portion of the upper portion 121b of the lower contact plug 121 may be less than a width of an adjacent portion of the lower portion 121a of the lower contact plug 121 at an interface location. A barrier pattern 130 may be provided on a sidewall of the lower contact plug 121 and surround at least a portion of the lower contact plug 121. The lower contact plug 121 and the barrier pattern 130 may include the same material, but alternatively have different materials from each other. The lower contact plug 121 and the barrier pattern 130 may include tungsten, titanium, and/or tantalum. For example, the lower contact plug 121 may include tungsten and the barrier pattern 130 may include tungsten nitride.

The barrier pattern 130 may have a top surface 131 whose level is lower than that of a top surface 123b of the lower contact plug 121. Herein, the level may refer to a distance from the top surface of the semiconductor substrate 100 along a third direction D3 that is orthogonal to directions D1 and D2 and is further orthogonal to at least a surface of the semiconductor substrate 100. Referring to FIG. 4, the lower contact plug 121 may include a first part 121a and a second part 121b whose respective top surfaces 123a and 123b are positioned at different levels. The first part 121a (also referred to herein as a lower portion 121a of the lower contact plug 121) may have the top surface 123a whose level is the same or substantially the same (e.g., the same within manufacturing and/or material tolerances) as that of the top surface 131 of the barrier pattern 130, and the second part 121b may have the top surface 123b whose level is higher than that of the top surface 131 of the barrier pattern 130. As viewed in plan in FIG. 3A, the second part 121b may occupy a central portion of the lower contact plug 121 and the first part 121a may surround the second part 121b. In other words, the first part 121a may have a width greater than that of the second part 121b. As shown in FIG. 4, the widths of adjacent portions of the first and second portions 121a and 121b may be different, such that a width of the adjacent portion of the second part 121b is less than the width of the adjacent portion of the first part 121a. In some example embodiments, a width of one or more portions of the first part 121a may be the same or substantially the same (e.g., the same within manufacturing and/or material tolerances) as a width of one or more portions of the second part 121b.

Being adjacent to the lower contact plug 121, an insulation pattern 140 may be disposed between the barrier pattern 130 and a magnetic tunnel junction pattern 150. The insulation pattern 140 may cover at least a top surface 131 of the barrier pattern 130. The insulation pattern 140 may cover a sidewall of the second part 121b and further cover a top surface 123a of the first part 121a and the top surface 131 of the barrier pattern 130. As shown in FIG. 4, the insulation layer 140 may include an upper portion and a lower portion whose width is greater than a width of the upper portion. In some example embodiments, the insulation layer 140 may include an upper portion whose width is equal to or greater than a width of the lower portion of the insulation layer 140. As shown in FIG. 4, the insulation layer 140 may include a portion, for example, the lower portion thereof, that horizontally protrudes from a sidewall of the barrier pattern 130. The insulation pattern 140 may include a sidewall connected to a sidewall of the magnetic tunnel junction pattern 150 such that the sidewalls of the insulation layer 140 and the magnetic tunnel junction pattern 150 may form separate portions of the same surface (e.g., a common, continuous surface). In this description, two sidewalls that are described as being connected to form the same surface may be understood to refer to two sidewalls form separate, adjacent portions of the same (e.g., common) flat and/or curved surface. The surface may include a three-dimensional surface as well as a two-dimensional surface. The insulation pattern 140 may include silicon nitride, silicon oxide, silicon oxynitride, or low-k dielectric material having a low dielectric constant. For example, the insulation pattern 140 may include silicon oxide. The insulation pattern 140 may include the same material as the lower interlayer dielectric layer 110. Alternatively, the insulation pattern 140 may include a material different from that of the lower interlayer dielectric layer 110.

The magnetic tunnel junction pattern 150 may be disposed on the lower interlayer dielectric layer 110 and electrically connected to the lower contact plug 121. The magnetic tunnel junction pattern 150 may include a free magnetic layer FL, a reference magnetic layer RL, and a tunnel barrier layer TBL between the free and reference magnetic layers FL and RL. Moreover, the magnetic tunnel junction pattern 150 may further include the bottom electrode BE between the lower contact plug 121 and the reference magnetic layer RL and a top electrode TE between the free magnetic layer FL and an upper contact plug 160.

The reference magnetic layer RL may have a unidirectionally fixed magnetization direction. The free magnetic layer FL may have a magnetization direction that can be changed to be either parallel or anti-parallel to the fixed magnetization direction of the reference magnetic layer RL in response to a program operation. In some embodiments, the magnetization directions of the reference and free magnetic layers RL and FL may be perpendicular to an interface between the tunnel barrier layer TBL and the free magnetic layer FL. In other words, the reference and free magnetic layers RL and FL may include a magnetic material having perpendicular magnetic anisotropy. Alternatively, the reference and free magnetic layers RL and FL may include a magnetic material having horizontal magnetic anisotropy. The magnetization direction of the free magnetic layer FL may be changed by an STT (spin torque transfer) program operation. That is, the magnetization direction of the free magnetic layer FL may be changed using a spin torque of electrons in a program current.

The lower interlayer dielectric layer 110 between the magnetic tunnel junction patterns 150 may have a structure that is recessed toward the semiconductor substrate 100. The lower interlayer dielectric layer 110 may have a top surface at least a portion of which is positioned lower than a bottom surface of the insulation pattern 140, as shown in FIG. 4. Referring to FIG. 4, the lower interlayer dielectric layer 110 may include an uppermost top surface whose level is same or substantially the same (e.g., the same within manufacturing and/or material tolerances) as that of the top surface 131 of the barrier pattern 130, but the present inventive concepts are not limited thereto.

An upper interlayer dielectric layer 112 may be disposed on the lower interlayer dielectric layer 110 and cover the tunnel junction pattern 150. The upper contact plug 160 may penetrate the upper interlayer dielectric layer 112 and be connected to the top electrode TE. For example, the upper contact plug 160 may include at least one of metal (e.g., tungsten, titanium, and/or tantalum) and conductive metal nitride (e.g., titanium nitride, tantalum nitride, and/or tungsten nitride).

Bit lines BL may be disposed on the upper interlayer dielectric layer 112 and connected to the magnetic tunnel junction patterns 150 through a plurality of the upper contact plugs 160. The upper contact plugs 160 may be respectively coupled to the top electrodes TE of the magnetic tunnel junction patterns 150. For example, the bit lines BL may extend in the first direction D1 and be spaced apart from each other in the second direction D2. The bit lines BL may include at least one of, for example, metal (e.g., tungsten, titanium, and/or tantalum) and conductive metal nitride (e.g., titanium nitride, tantalum nitride, and/or tungsten nitride).

Referring to FIGS. 3B and 4, two cell structures CS1 and CS2 are illustrated. Each of the cell structures CS1 and CS2 may correspond to the formerly described unit memory cell MC and include the lower contact plug 121, the barrier pattern 130, the insulation pattern 140, the magnetic tunnel junction pattern 150, and the upper contact plug 160 that are aforementioned above. In addition, the cell structures CS1 and CS2 may share the select transistor and the bit line BL. FIG. 3B shows an enlarged view of each of the cell structures CS1 and CS2 of FIG. 3A. FIG. 3B is provided for apprehending alignment of the cell structures CS1 and CS2 in plan view, showing the lower contact plug 121, the barrier pattern 130, and the magnetic tunnel junction pattern 150.

Referring of FIGS. 3B and 4, a left cell structure (referred to as hereinafter a first cell structure CS1) may exhibit an alignment state (e.g., an aligned structure) and a right cell structure (referred to as hereinafter a second cell structure CS2) may exhibit a misaligned structure (e.g., a misalignment state). Herein, the term of alignment state may mean that a central axis of the magnetic tunnel junction pattern 150 is aligned with a central axis of the lower contact plug 121, and the term of misalignment state may mean that the central axis of the magnetic tunnel junction pattern 150 is offset from the central axis of the lower contact plug 121, as shown in FIG. 3B.

As viewed in plan in FIG. 3B, in the first cell structure CS1, the magnetic tunnel junction pattern 150 may partially expose one or more top surfaces 131 of the barrier pattern 130 as shown in section A of FIG. 3B. As viewed in plan, in the second cell structure CS2, the magnetic tunnel junction pattern 150 may partially expose a top surface 131 of the barrier pattern 130 and a top surface 123a, 123b of one or more portions of the lower contact plugs 121 in the barrier pattern as shown in section B of FIG. 3B. In some example embodiments, even the magnetic tunnel junction pattern 150 and the lower contact plug 121 are formed offset from each other, and the insulation pattern 140 may limit and/or prevent one or more top surfaces 123a, 123b of the lower contact plug 121 from being exposed. It thus may be possible to increase an overlay margin when the magnetic tunnel junction pattern 150 is formed.

FIGS. 5A to 5E show a method for manufacturing the semiconductor memory device of FIG. 4. For brevity of the description in FIGS. 5A to 5E, ones of the components shown in FIG. 4 are omitted and other ones of the components shown in FIG. 4 are exaggeratingly illustrated.

Figure 5A:
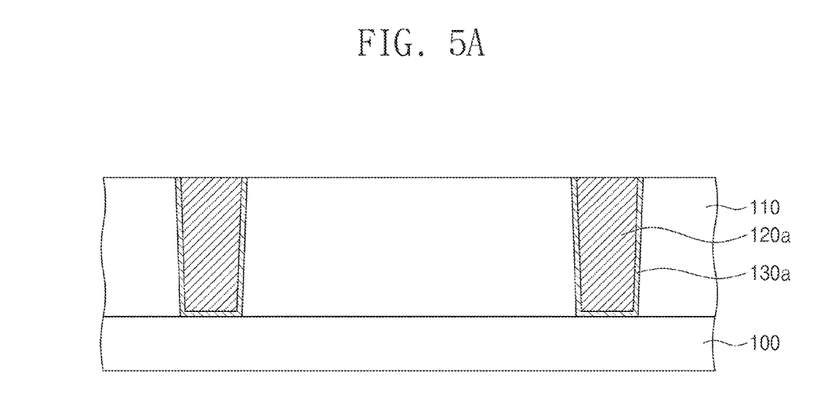
FIGS. 5A-5E show a method for manufacturing the semiconductor memory device of FIG. 4.

Referring to FIG. 5A, a lower interlayer dielectric layer 110 may be formed on a semiconductor substrate 100, and contact holes (not shown) may be formed in the lower interlayer dielectric layer 110 to partially expose the semiconductor substrate 100. In more detail, a mask pattern (not shown) may be formed on the lower interlayer dielectric layer 110 and a lithography process may be performed to form the contact holes (not shown). A barrier layer (not shown) may be formed on the exposed contact holes (not shown) and the semiconductor substrate 100. The barrier layer (not shown) may be deposited to a thickness in the range, for example, from about 20 Å to about 60 Å. Thereafter, a metal layer (not shown) may be formed on the barrier layer (not shown) in the contact holes (not shown). The barrier layer (not shown) and the metal layer (not shown) may include but not limited to the same material. For example, the metal layer (not shown) may include tungsten and the barrier layer (not shown) may include tungsten nitride. Thereafter, a planarization process may be performed to expose the lower interlayer dielectric layer 110 and form a preliminary lower contact plug 120a and a preliminary barrier pattern 130a.

Figure 5B:
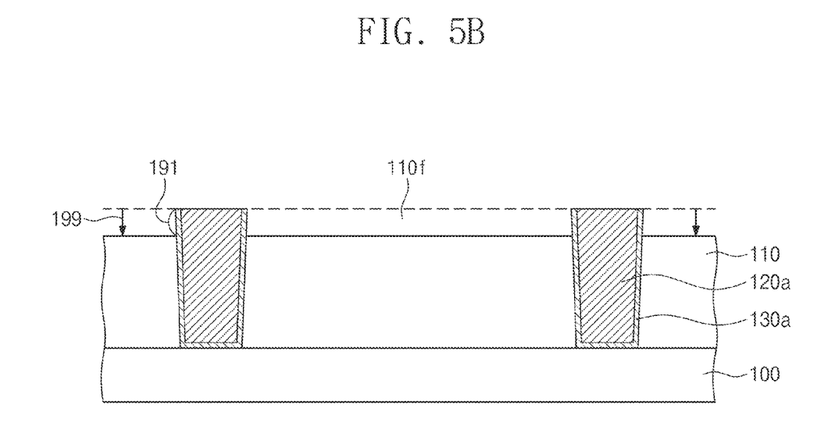

Referring to FIG. 5B, an upper portion 110f of the lower interlayer dielectric layer 110 may be selectively removed 199 to expose upper portions 191 of the preliminary lower contact plug 120a and the preliminary barrier pattern 130a.

Figure 5C:
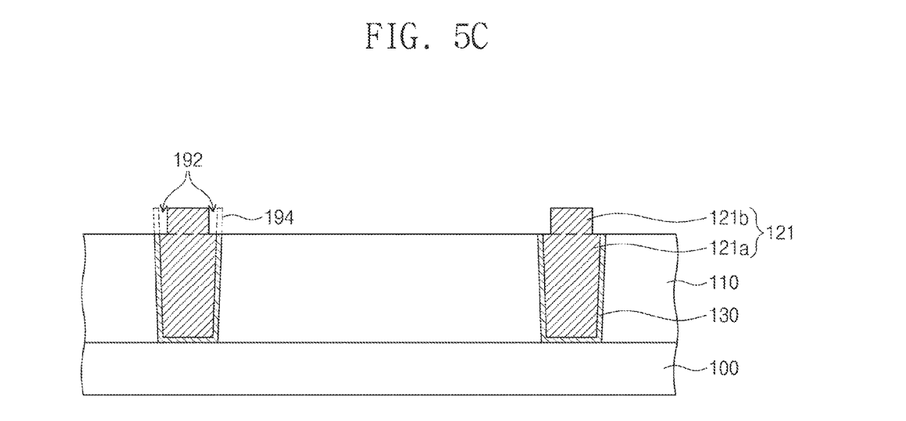

Referring to FIG. 5C, a lower contact plug 121 and a barrier pattern 130 may be formed by selectively removing portions 192, 194 of the preliminary lower contact plug 120a and the preliminary barrier pattern 130a that are exposed through the lower interlayer dielectric layer 110, respectively. The preliminary lower contact plug 120a and the preliminary barrier pattern 130a may be selectively etched by a wet etch process or alternatively by an ion beam etch process. The lower contact plug 121 may include a first part 121a and a second part 121b. The first part 121a may be a lower portion of the lower contact plug 121, and the second part 121b may be an upper portion of the lower contact plug 121. The first part 121a may have a top surface whose level is the same as that of a top surface of the of the barrier pattern 130. The second part 121b may have a top surface whose level is higher than that of the top surface of the of the barrier pattern 130.

Figure 5D:
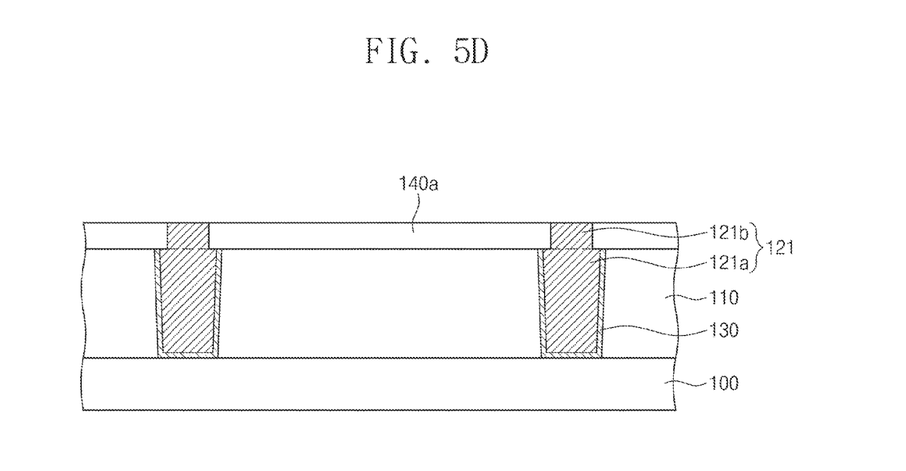

Referring to FIG. 5D, an insulation layer 140a may be formed on the lower interlayer dielectric layer 110, the barrier pattern 130, and the lower contact plug 121. The insulation layer 140a may include silicon nitride, silicon oxide, silicon oxynitride, or low-k dielectric material having a low dielectric constant. For example, the insulation layer 140a may include silicon oxide. The insulation layer 140a may include the same material as the lower interlayer dielectric layer 110. Alternatively, the insulation layer 140a may include a material different from that of the lower interlayer dielectric layer 110. Thereafter, a planarization process may be performed on the insulation layer 140a and thus the lower contact plug 121 may be exposed. The planarization process may be performed using an anisotropic etch process or a chemical mechanical polishing (CMP) process.

Figure 5E:
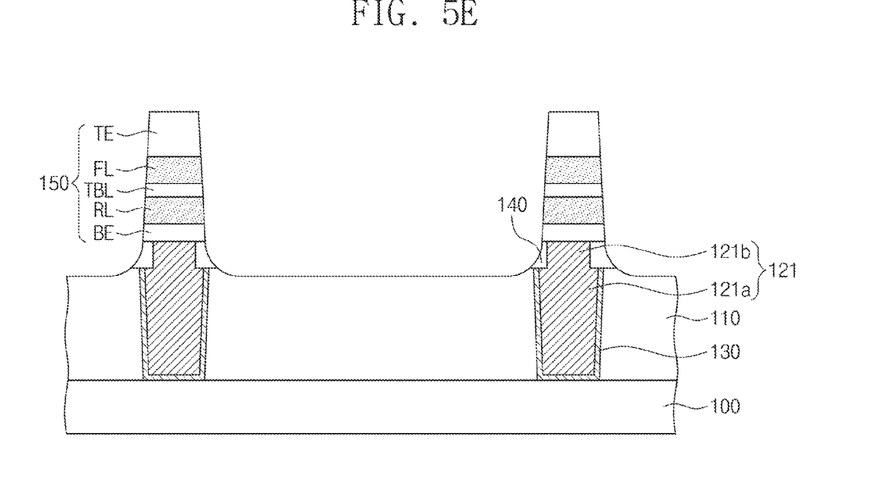

Referring to FIG. 5E, a magnetic tunnel junction layer (not shown) may be formed on the insulation layer 140a and the lower contact plug 121. The magnetic tunnel junction layer (not shown) may include a bottom electrode layer, a free magnetic layer, a tunnel barrier layer, a reference magnetic layer, and a top electrode layer that are sequentially stacked. Next, conductive mask patterns (not shown) may be formed on the magnetic tunnel junction layer (not shown) so as to define regions where magnetic tunnel junction patterns are formed. In more detail, the magnetic tunnel junction layer (not shown) may be patterned using the conductive mask patterns (not shown) as an etch mask and thus magnetic tunnel junction patterns 150 may be formed spaced apart from each other on the semiconductor substrate 100.

A sputter etch process may be used to pattern the magnetic tunnel junction layer (not shown). Specifically, the semiconductor substrate 100 may be provided with an ionized inert gas (e.g., an argon ion (Ar+)). A voltage may be applied to accelerate the ionized inert gas and therefore an ion beam may be provided to the semiconductor substrate 100. The ion beam may have incident energy proportional to the applied voltage. For example, the voltage may have a magnitude in the range from about 1000V to about 2000V.

In this step, the magnetic tunnel junction patterns 150 may be used as an etch mask to etch at least portions of the insulation layer 140a and the lower interlayer dielectric layer 110 simultaneously with each other. As a result, the lower interlayer dielectric layer 110 may have a top surface whose lowermost level is lower than a level of the top surface of the barrier pattern 130. Being adjacent to the lower contact plug 121, an insulation pattern 140 may be formed between the barrier pattern 130 and the magnetic tunnel junction pattern 150. The insulation pattern 140 may have a bottom surface whose level is higher than the lowermost level of the top surface of the lower interlayer dielectric layer 110.

An upper interlayer dielectric layer 112 may be formed on the magnetic tunnel junction patterns 150 and the lower interlayer dielectric layer 110, and an upper contact plug 160 may be formed on the upper interlayer dielectric layer 112 and connected to the bottom electrode TE. Thereafter, bit lines BL may be disposed on the upper interlayer dielectric layer 112 and thus a semiconductor device of FIG. 4 may be manufactured.

According to some example embodiments of the present inventive concepts, the insulation pattern 140 may cap ("cover") the lower contact plug 121 and the barrier pattern 130, so that one or more top surfaces and/or sidewalls of the lower contact plug 121 and the barrier pattern 130 may not be exposed when the sputter etch process is performed. It therefore may be possible to increase an overlay margin and limit and/or prevent a metal material from being redeposited when the magnetic tunnel junction pattern 150 is formed.

Assuming that one or more top surfaces and/or sidewalls of the lower contact plug 121 and the barrier pattern 130 are exposed when the sputter etch process is performed, etch byproducts may be generated from the lower contact plug 121 and the barrier pattern 130 so that the etch byproducts may be redeposited to form a redeposition layer on a sidewall of each of the magnetic tunnel junction patterns 150. In particular, there may be an increased probability of exposure of the lower contact plug 121 and the barrier pattern 130 in the misaligned structure CS2. According to some example embodiments of the present inventive concepts, the probability of exposure of the lower contact plug 121 and the barrier pattern 130 (including at least a portion of a top surface of one or more of the lower contact plug 121 and the barrier pattern 130) may be reduced in the misaligned structure CS2, based at least in part upon the insulation pattern 140.

Figure 6A:
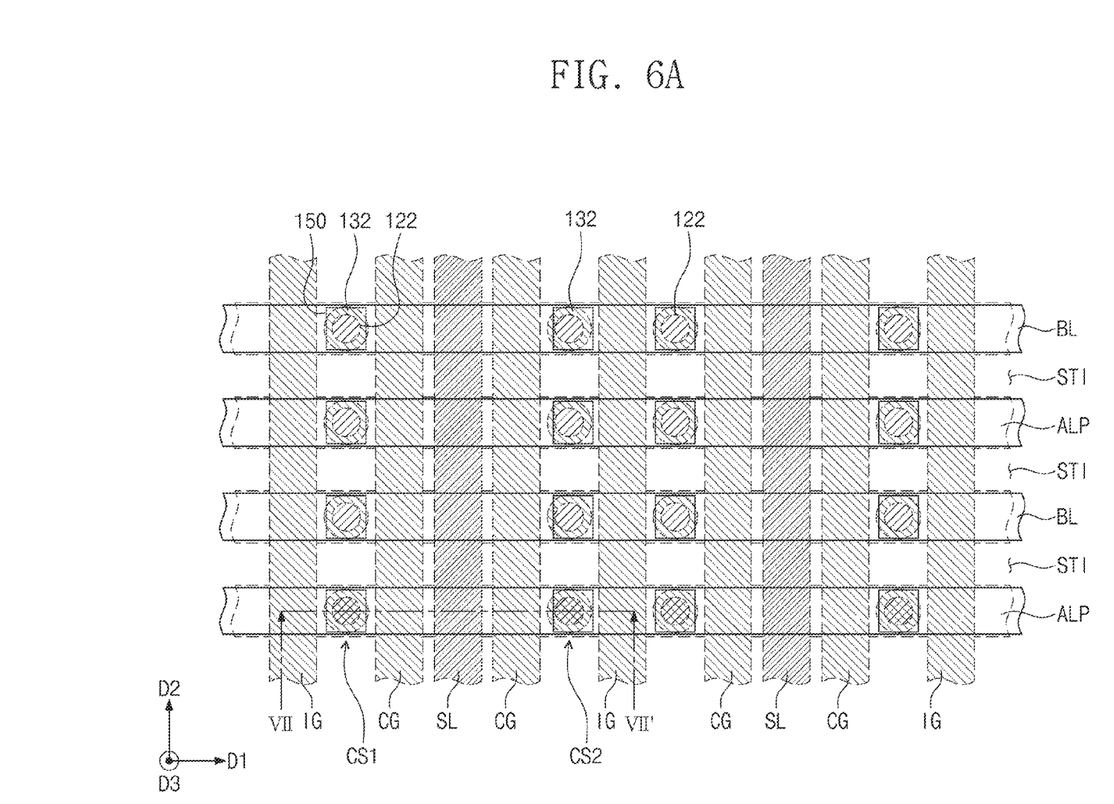
FIG. 6A is a plan view illustrating a semiconductor memory device according to some example embodiments of the present inventive concepts.
Figure 6B:
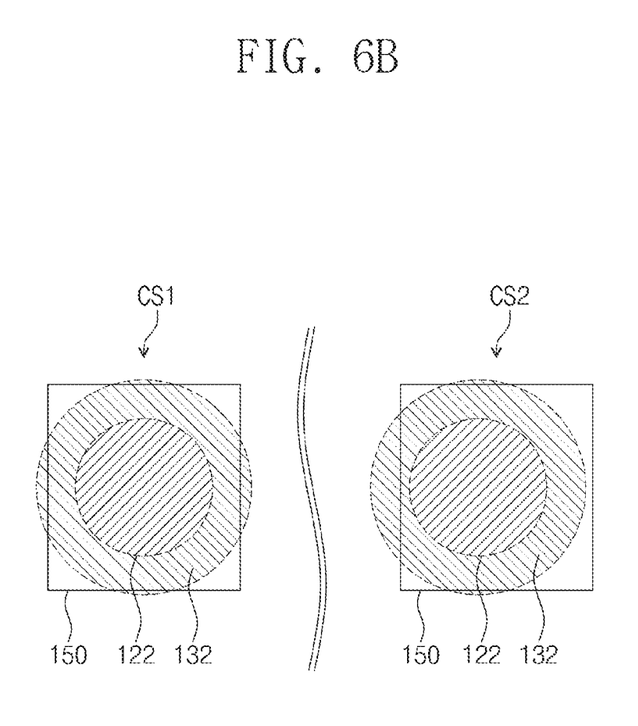
FIG. 6B is an enlarged view of the cell structures of FIG. 6A.
Figure 7:
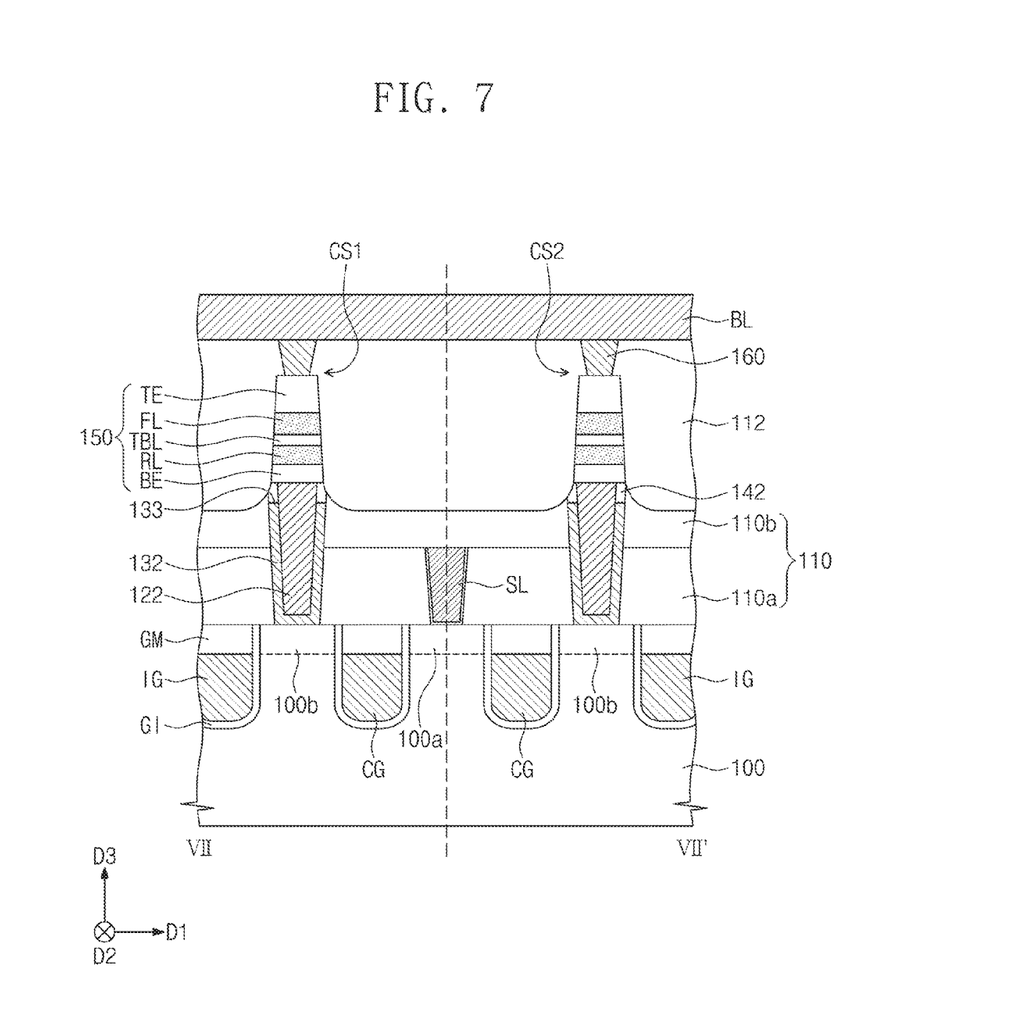
FIG. 7 is a cross-sectional view taken along line VII-VII' of FIG. 6A illustrating a semiconductor memory device according to some example embodiments of the present inventive concepts.

FIG. 6A is a plan view illustrating a semiconductor memory device according to some example embodiments of the present inventive concepts, and FIG. 6B is an enlarged plan view of the cell structures CS1 and CS2 of FIG. 6A. FIG. 7 is a cross-sectional view taken along line VII-VII' of FIG. 6A illustrating a semiconductor memory device according to some example embodiments of the present inventive concepts. Those parts of a semiconductor memory device of FIGS. 6A to 7 substantially the same as those of the semiconductor memory device discussed with reference to FIGS. 3A to 5 are allocated to the same reference numerals thereto and repetitive description thereof may be omitted in the interest of brevity.

Referring to FIG. 7, a lower contact plug 122 may have a top surface at a single level. The lower contact plug 122 may have the top surface whose level is higher than that of a top surface 133 of a barrier pattern 132. The barrier pattern 132 may have a thickness greater than that of the barrier pattern 130 of FIG. 4. For example, the barrier pattern 132 may have a thickness in the range from about 100 Å to about 500 Å. An insulation pattern 142 may have a sidewall coplanar with a sidewall of the barrier pattern 132.

FIGS. 8A to 8D show a method for manufacturing the semiconductor memory device of FIG. 7. For brevity of the description in FIGS. 8A to 8D, ones of the components shown in FIG. 7 are omitted and other ones of the components shown in FIG. 7 are exaggeratingly illustrated.

Figure 8A:
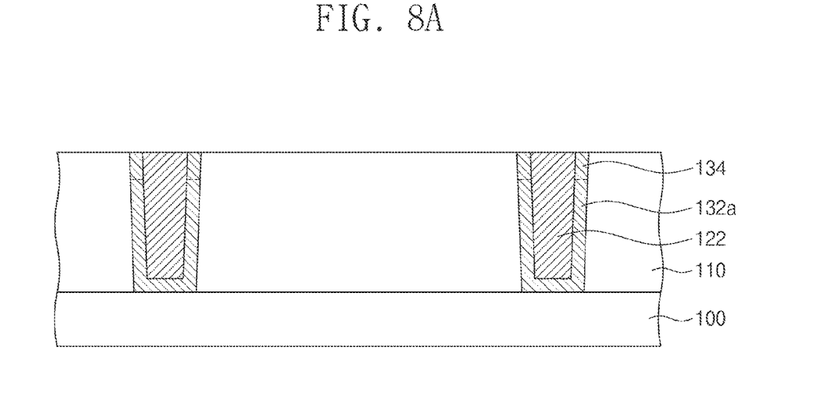
FIGS. 8A-8D show a method for manufacturing the semiconductor memory device of FIG. 7.

Referring to FIG. 8A, a lower interlayer dielectric layer 110 may be formed on a semiconductor substrate 100, and contact holes (not shown) may be formed in the lower interlayer dielectric layer 110 to partially expose the semiconductor substrate 100. The lower interlayer dielectric layer 110 may include silicon oxide. In more detail, a mask pattern (not shown) may be formed on the lower interlayer dielectric layer 110 and a lithography process may be performed to form the contact holes (not shown). A barrier layer (not shown) may be formed on the exposed contact holes (not shown) and the semiconductor substrate 100. The barrier layer (not shown) may be deposited to have a thickness in the range, for example, from about 100 Å to about 500 Å. Thereafter, a metal layer (not shown) may be formed on the barrier layer (not shown) in the contact holes (not shown). The barrier layer (not shown) and the metal layer (not shown) may include but not limited to the same material. For example, the metal layer (not shown) may include tungsten and the barrier layer (not shown) may include tungsten nitride. Thereafter, a planarization process may be performed to expose the lower interlayer dielectric layer 110 and form a lower contact plug 122 and a preliminary barrier pattern 132a.

Figure 8B:
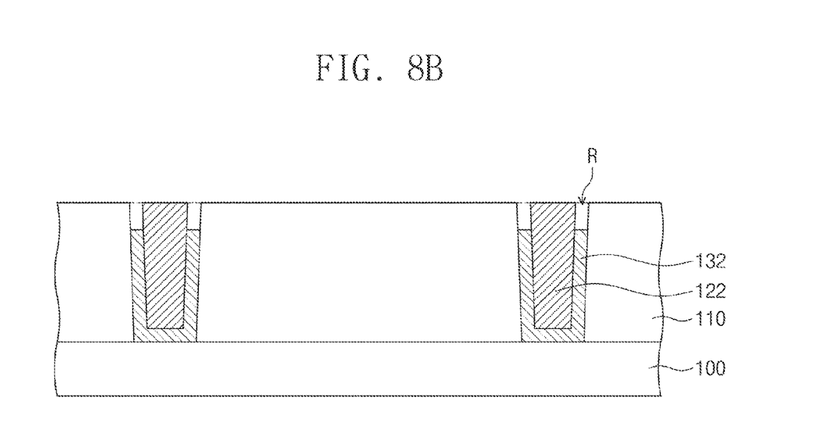

Referring to FIG. 8B, a recess R may be formed by selectively removing a portion 134 of the preliminary barrier pattern 132a. For example, the preliminary barrier pattern 132a may be selectively etched using a material having an etch selectivity with respect to nitride. As not shown in figures, since the lower contact plug 122 and the preliminary barrier pattern 132a include the same material, the lower contact plug 122 may also be partially etched.

Figure 8C:
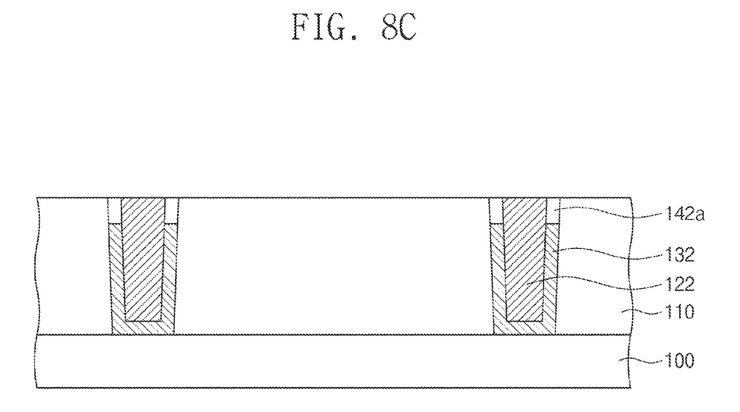

Referring to FIG. 8C, an insulation layer (not shown) may be formed on the lower interlayer dielectric layer 110, the recess R, and the lower contact plug 122. The insulation layer (not shown) may include silicon nitride, silicon oxide, silicon oxynitride, or low-k dielectric material having a low dielectric constant. For example, the insulation layer (not shown) may include silicon oxide. The insulation layer (not shown) may include the same material as the lower interlayer dielectric layer 110. Alternatively, the insulation layer (not shown) may include a material different from that of the lower interlayer dielectric layer 110. Thereafter, a planarization process may be performed on the insulation layer (not shown) to expose the lower contact plug 122 so that a preliminary insulation pattern 142a may be formed to fill the recess R. The planarization process may be performed using an anisotropic etch process or a chemical mechanical polishing (CMP) process.

Figure 8D:
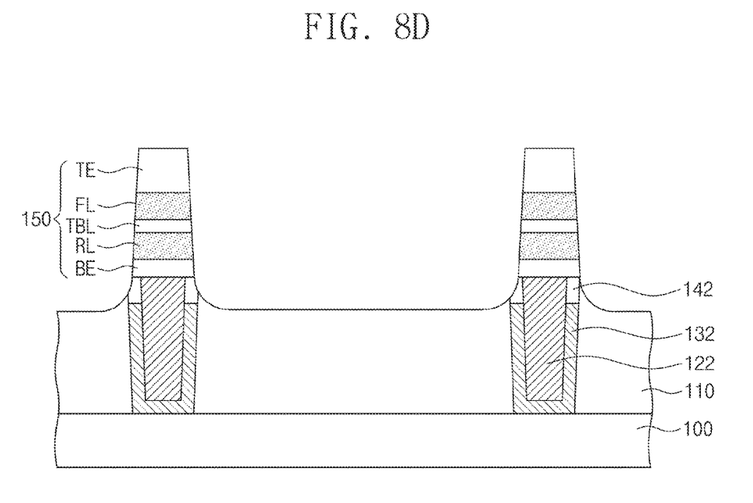

Referring to FIG. 8D, a magnetic tunnel junction layer (not shown) may be formed on the preliminary insulation pattern 142a and the lower contact plug 122. Thereafter, aforementioned processes may be performed to form magnetic tunnel junction patterns 150. A description of duplicate components is omitted.

Referring to FIGS. 6B and 7, in all of the aligned first cell structure CS1 and the misaligned second cell structure CS2, the magnetic tunnel junction pattern 150 may expose at least the top surface 133 of the barrier pattern 132 and may not expose the top surface of the lower contact plug 122, as viewed in plan.

According to the present inventive concepts, the insulation pattern 142 may cap the lower contact plug 122 and the barrier pattern 132, so that the lower contact plug 122 and the barrier pattern 132 may not be exposed when the sputter etch process is performed. Therefore, it may be possible to increase an overlay margin and limit and/or prevent a metal material from being redeposited when the magnetic tunnel junction pattern 150 is formed.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor memory device, comprising:
   a select element on a semiconductor substrate;
   a magnetic tunnel junction pattern on the select element;
   a lower contact plug connecting the select element to the magnetic tunnel junction pattern;
   a barrier pattern covering a lower portion of a sidewall of the lower contact plug; and
   an insulation pattern covering an upper portion of the sidewall of the lower contact plug, the insulation pattern being between the barrier pattern and the magnetic tunnel junction pattern, the insulation pattern including an upper portion and a lower portion, the lower portion having a greater width than a width of the upper portion, the barrier pattern including a first material, the insulation pattern including a second material different from the first material,
   wherein the magnetic tunnel junction pattern includes
      a bottom electrode on the lower contact plug,
      a top electrode,
      first and second magnetic layers between the top and bottom electrodes, and
      a tunnel barrier layer between the first and second magnetic layers, and
   wherein the lower contact plug includes an upper portion connected to the bottom electrode, the upper portion of the lower contact plug having a smaller width than a width of the bottom electrode.

2. The semiconductor memory device of claim 1, wherein the insulation pattern horizontally protrudes from a sidewall of the barrier pattern.

3. The semiconductor memory device of claim 1, wherein the insulation pattern includes a sidewall, the sidewall of the insulation pattern being substantially coplanar with a sidewall of the barrier pattern.

4. The semiconductor memory device of claim 1, wherein the magnetic tunnel junction pattern includes a sidewall connected to a sidewall of the insulation pattern such that a sidewall of the barrier pattern and the sidewall of the insulation pattern are separate portions of a common, continuous surface.

5. The semiconductor memory device of claim 1, further comprising:
   a plurality of lower contact plugs; and
   an insulation layer between adjacent lower contact plugs of the plurality of lower contact plugs, the insulation layer including a top surface, the top surface of the insulation layer being at least partially at a lower elevation than a bottom surface of the insulation pattern, relative to the semiconductor substrate.

6. The semiconductor memory device of claim 5, wherein the insulation pattern and the insulation layer include a common material.

7. The semiconductor memory device of claim 1, wherein the lower contact plug includes,
   a first part having a top surface, the top surface of the first part being substantially coplanar with a top surface of the barrier pattern; and
   a second part having a top surface, the top surface of the second part being elevated above the top surface of the first part.

8. The semiconductor memory device of claim 1, wherein the magnetic tunnel junction pattern at least partially exposes at least one top surface of the barrier pattern.

9. The semiconductor memory device of claim 8, wherein the magnetic tunnel junction pattern at least partially exposes at least one top surface of the lower contact plug.

* * * * *